US012615750B2

(12) United States Patent
Nakasaka et al.

(10) Patent No.: US 12,615,750 B2
(45) Date of Patent: Apr. 28, 2026

(54) POWER CONTROL APPARATUS

(71) Applicant: DENSO CORPORATION, Kariya-city (JP)

(72) Inventors: Akira Nakasaka, Kariya-city (JP); Seiichiro Nishimachi, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 418 days.

(21) Appl. No.: 18/319,057

(22) Filed: May 17, 2023

(65) Prior Publication Data

US 2023/0292475 A1 Sep. 14, 2023

Related U.S. Application Data

(63) Continuation of application No. PCT/JP2021/039758, filed on Oct. 28, 2021.

(30) Foreign Application Priority Data

Nov. 30, 2020 (JP) ................................. 2020-198005

(51) Int. Cl.
*H05K 7/20* (2006.01)
*H02M 1/32* (2007.01)

(52) U.S. Cl.
CPC ........ *H05K 7/20936* (2013.01); *H02M 1/327* (2021.05); *H05K 7/20327* (2013.01)

(58) Field of Classification Search
CPC .......... H05K 7/20936; H05K 7/20327; H02M 1/327
See application file for complete search history.

(56) References Cited

U.S. PATENT DOCUMENTS

| | | | |
|---|---|---|---|
| 2015/0101347 A1 | 4/2015 | Potter et al. | |
| 2019/0122958 A1* | 4/2019 | Uneme | .............. H05K 7/20927 |
| 2019/0148265 A1* | 5/2019 | Kitamura | .......... H01L 23/53209 |
| | | | 257/714 |

FOREIGN PATENT DOCUMENTS

| | | | | |
|---|---|---|---|---|
| JP | 2008022648 A | * | 1/2008 | |
| JP | 2012222943 A | * | 11/2012 | |
| JP | 2019075957 A | * | 5/2019 | ........ H02M 7/53871 |
| JP | 6563161 B1 | | 8/2019 | |

* cited by examiner

*Primary Examiner* — Catherine T. Rastovski
(74) *Attorney, Agent, or Firm* — Oliff PLC

(57) ABSTRACT

A power control apparatus has a plurality of switch units, a cooling unit, and an electronic control circuit. The electronic control circuit is configured to perform: measuring temperatures of each of the plurality of switch units; comparing the temperatures of each of the plurality of switch units measured in the measuring step; and determining whether a temperature difference between any two of the plurality of switch units is greater than or equal to a threshold value based on information from the comparing step.

6 Claims, 10 Drawing Sheets

POWER CONTROL APPARATUS

CROSS REFERENCE TO RELATED APPLICATIONS

The present application is a continuation application of International Patent Application No. PCT/JP2021/039758 filed on Oct. 28, 2021, which designated the U.S. and is based on and claims the benefit of priority from Japanese Patent Application No. 2020-198005 filed on Nov. 30, 2020, and the entire disclosure of the above application is incorporated herein by reference.

TECHNICAL FIELD

The disclosure provided in this specification relates to power control apparatus.

BACKGROUND

A power control apparatus includes a converter circuit and/or an inverter circuit for controlling an electric power between a power source such as a battery and a load such as a motor and/or a generator. The converter circuit and/or the inverter circuit uses at least one power switching element such as an IGBT or the like. It is important to manage thermal issue of the power switching element. In the above aspects, or in other aspects not mentioned, there is a need for further improvements in a power control apparatus.

SUMMARY

According to an aspect of the present disclosure a power control apparatus comprises: a plurality of switch units; a cooling unit which supports a plurality of switch units and cools each of the plurality of switch units with a cooling medium which is supplied to flow in an internal space in one direction perpendicular to a direction in which the plurality of switch units are aligned in an aligned direction; a measuring unit which measures temperatures of each of the plurality of switch units; a comparison unit which compares the temperatures of each of the plurality of switch units measured by the measuring unit; and a determination unit which determines whether a temperature difference between any two of the plurality of switch units is greater than or equal to a threshold value based on information from the comparison unit. The measuring unit, the comparison unit, and the determination unit are provided by an electronic control circuit. The electronic control circuit is configured to perform functions in the measuring unit, the comparison unit, and the determination unit.

According to the present disclosure, if there is no temperature abnormality in each of the plurality of switch units, it is expected that the temperature difference between the plurality of switch units are minute. Therefore, it is determined whether or not a temperature difference between two of the plurality of switch units is greater than or equal to a threshold value. By doing so, it is possible to determine whether or not a temperature anomaly has occurred in some of the plurality of switch units.

BRIEF DESCRIPTION OF DRAWINGS

The disclosure is further described with reference to the accompanying drawings in which:

FIG. 6 is a top view of components shown in FIG. 5 from which s first substrate, a first power supply busbar, a second power supply busbar, and a capacitor case are removed;

FIG. 7 is a top view of components shown in FIG. 6 from which a switch module is removed;

DETAILED DESCRIPTION

Figure 1:
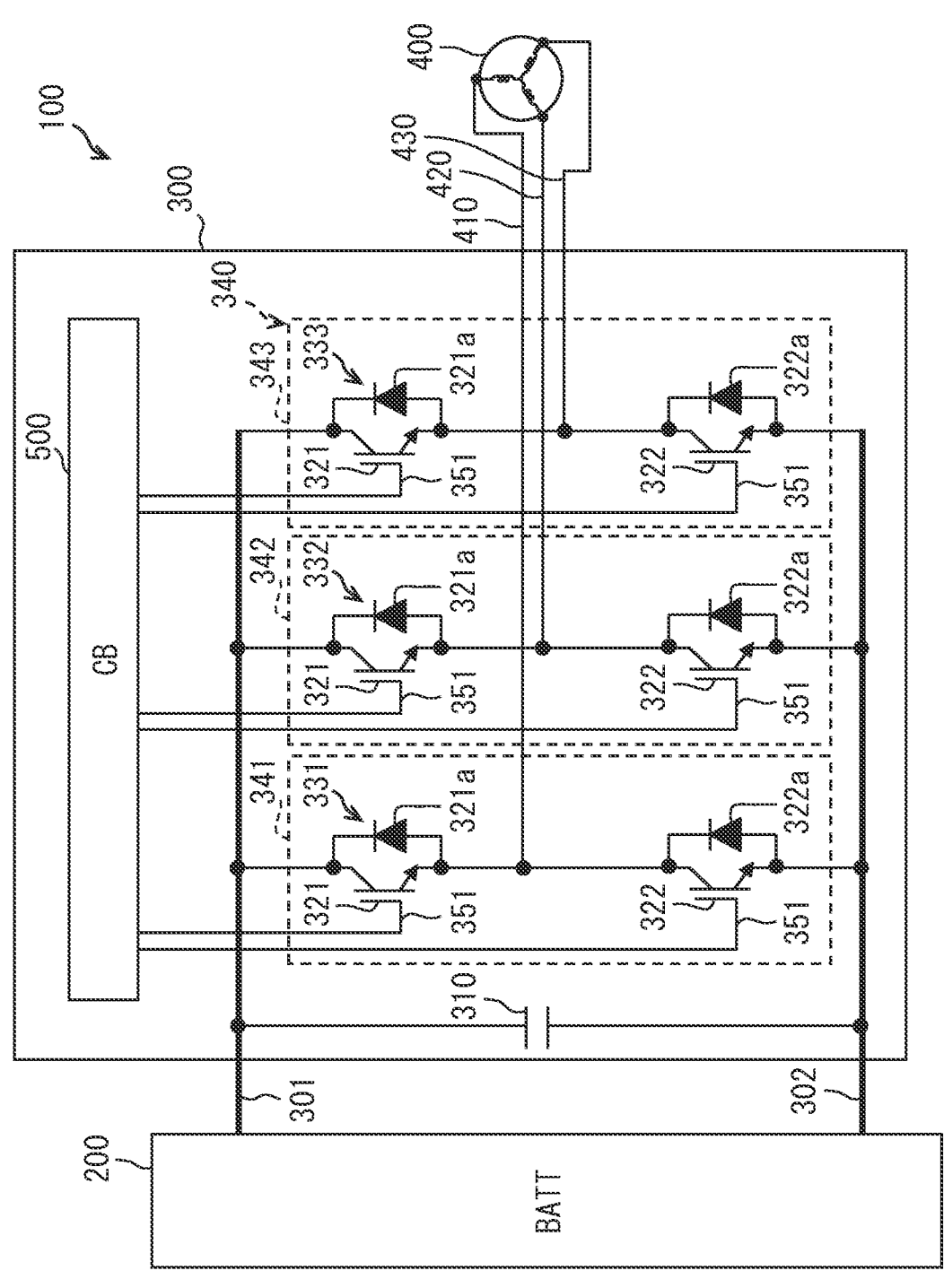
FIG. 1 is a circuit diagram for explaining an in-vehicle system.

JP6563631B describes a power conversion unit including a power control apparatus including a semiconductor element and a cooler through which a cooling medium for cooling the power control apparatus flows.

In the configuration described in JP6563631B, if a cooling medium performs a heat exchange with some of the plurality of semiconductor elements and further performs a heat exchange with the other semiconductor elements, even if there is no temperature abnormality in the plurality of semiconductor elements, a temperature difference occurs among the plurality of semiconductor elements. Therefore, it was not possible to determine whether or not some of the plurality of semiconductor elements (switches) had a temperature anomaly.

Accordingly, it is an object of the present disclosure to provide a power control apparatus capable of determining an abnormality with respect to a temperature of the switch section.

The following describes embodiments for carrying out the present disclosure with reference to the drawings. In each embodiment, parts corresponding to the elements described in the preceding embodiments are denoted by the same reference numerals, and redundant explanation may be omitted. When only a part of a configuration is described in an embodiment, another preceding embodiment may be applied to the other parts of the configuration.

It may be possible not only to combine parts the combination of which is explicitly described in an embodiment, but also to combine parts of respective embodiments the combination of which is not explicitly described if any obstacle does not especially occur in combining the parts of the respective embodiments.

First Embodiment

First, an in-vehicle system 100 provided with a power control apparatus 300 is described based on FIG. 1. The in-vehicle system 100 is a system for an electric vehicle. The in-vehicle system 100 includes a battery 200, a power control apparatus 300, and a motor 400.

The power control apparatus 300 includes a substrate 500. A plurality of ECUs (not shown) and a gate driver (not shown) are mounted on the substrate 500. The ECUs transmit signals to and receive signals from each other via a bus wiring. The ECUs control the electric vehicle in a cooperative manner. Further, regeneration and powering of the motor 400 according to SOC of the battery 200 are controlled via the gate driver. SOC is an abbreviation of a state of charge. ECU is an abbreviation of an electronic control unit.

The battery 200 includes a plurality of secondary batteries. The secondary batteries form a battery stack connected in series. The SOC of the battery stack corresponds to the SOC of the battery 200. As the secondary batteries, a lithium ion secondary battery, a nickel hydrogen secondary battery, an organic radical battery, or the like may be employed.

<Power Control Apparatus>

The power control apparatus 300 performs power conversion between the battery 200 and the motor 400 as an inverter. The power control apparatus 300 converts a DC power of the battery 200 into an AC power. The power control apparatus 300 converts an AC power generated by power generation, i.e., regeneration of a motor 400 into a DC power.

The motor 400 is coupled with an output shaft of an electric vehicle which is not shown. The rotational energy of the motor 400 is transmitted to traveling wheels of the electric vehicle via an output shaft. On the contrary, the rotational energy of the traveling wheels is transmitted to the motor 400 via the output shaft.

The motor 400 is electrically driven by the AC power supplied from the power control apparatus 300. Accordingly, propulsive force is applied to the traveling wheels. Further, the motor 400 performs regeneration by the rotational energy transmitted from the traveling wheels. The AC power generated by this regeneration is converted into the DC power by the power control apparatus 300. This DC power is supplied to the battery 200. The DC power is also supplied to various electric loads mounted on the electric vehicle.

The power control apparatus 300 includes semiconductor elements such as switches, which are described later. In this embodiment, n-channel IGBTs are used as the switches. However, MOSFETs may be used instead of the IGBTs for these switches. If the MOSFETs are used as the switches, the diode may be omitted.

These switches may be made from semiconductors such as Si and wide-gap semiconductors such as SiC. A material of semiconductor elements is not particularly limited.

<Electrical Connection of Power Control Apparatus>

The power control apparatus 300 is electrically connected to the battery 200 via a first power supply busbar 301 and a second power supply busbar 302. The power control apparatus 300 has the first power supply busbar 301, the second power supply busbar 302, a capacitor 310, a U-phase leg 331, a V-phase leg 332, a W-phase leg 333, and the substrate 500. The capacitor 310, the U-phase leg 331, the V-phase leg 331, and the W-phase leg 333 are connected between the first power supply busbar 301 and the second power supply busbar 302, respectively.

The first capacitor 310 is a smoothing capacitor which smooths pulsating current that occurs when the AC current is rectified to the DC current. The capacitor 310 has two electrodes. One electrode of these two electrodes is connected to the first power supply busbar 301. The other one electrode of these two electrodes is connected to the second power supply busbar 302.

Each of the U-phase leg 331, the V-phase leg 332, and the W-phase leg 333 has two switches connected in series. Each of the U-phase leg 331, the V-phase leg 332, and the W-phase leg 333 has a high-side switch 321 and a low-side switch 322 as switches. Also, each of the U-phase leg 331, the V-phase leg 332, and the W-phase leg 333 has a high-side diode 321a and a low-side diode 322a as diodes. A high-side switch 321, a low-side switch 322, a high-side diode 321a, and a low-side diode 322a included in each of the U-phase leg 331 to W-phase leg 333 are sealed with a resin member 360 to form a switch module 340.

As shown in FIG. 1, three legs are connected in parallel between the first power supply busbar 301 to the second power supply busbar 302. Three legs include the U-phase leg 331, the V-phase leg 332, and the W-phase leg 333. In each leg, a collector electrode of the high-side switch 321 is connected to the first power supply busbar 301. In each leg, an emitter electrode of the high-side switch 321 and a collector electrode of the low-side switch 322 are connected. In each leg, an emitter electrode of the low-side switch 322 is connected to the second power supply busbar 302. As a result, the high-side switch 321 and the low-side switch 322 are connected in series in an order from the first power supply busbar 301 to the second power supply busbar 302.

Further, in each leg, a cathode electrode of the high-side diode 321a is connected to the collector electrode of the high-side switch 321. In each legs, an anode electrode of the high-side diode 321a is connected to the emitter electrode of the high-side switch 321. In this configuration, the high-side diode 321a is connected to the high-side switch 321 in a reverse-parallel manner.

Similarly, in each leg, a cathode electrode of the low-side diode 322a is connected to the collector electrode of the low-side switch 322. In each legs, an anode electrode of the low-side diode 322a is connected to the emitter electrode of the low-side switch 322. In this configuration, the low-side diode 322a is connected to the low-side switch 322 in a reverse-parallel manner.

Furthermore, a U-phase busbar 410 is connected to a midpoint between the high-side switch 321 and the low-side switch 322 provided in the U-phase leg 331. The U-phase busbar 410 is connected to a U-phase stator coil of the motor 400.

A V-phase busbar 420 is connected to a midpoint between the high-side switch 321 and the low-side switch 322 of the V-phase leg 332. The V-phase busbar 420 is connected to a V-phase stator coil of the motor 400.

A W-phase busbar 430 is connected to a midpoint between the high-side switch 321 and the low-side switch 322 of the W-phase leg 333. The W-phase busbar 430 is connected to a W-phase stator coil of the motor 400.

If the motor 400 is powered, all of the high-side switches 321 and the low-side switches 322 provided in the U-phase leg 331, the V-phase leg 332, and the W-phase leg 333 are PWM-controlled by the control signal from the ECU. Thereby, a three-phase alternating current is generated in the power control apparatus 300. If the motor 400 generates (i.e., regenerates) electricity, the ECU stops outputting of a control signal, for example. As a result, the AC power generated by the power generation of the motor 400 passes through the U-phase leg 331, the V-phase leg 332, and the W-phase leg 333. As a result, the AC power and the DC power are converted in both directions.

<Mechanical Configuration of Power Control Apparatus>

A mechanical configuration of the power control apparatus 300 is described. Three directions orthogonal to one another are referred to as an x-direction, a y-direction, and a z-direction. The x-direction corresponds to a one direction. The y-direction corresponds to an aligned direction. The z-direction corresponds to the orthogonal direction.

The power control apparatus 300 has the capacitor 310, the three-phase switch module 340, the first power supply busbar 301, the second power supply busbar 302, and the substrate 500 as described above. The power control apparatus 300 also has a capacitor case 311, a first case 600, a cooling plate 700, a cover 800, and a second case 900 in addition to the components described above. Mechanical features of the switch module 340, the first power supply busbar 301, the second power supply busbar 302, the substrate 500, the capacitor case 311, the first case 600, the cover 800, the cooling plate 700, and the second case 900 are described below. Note that the cooling plate 700 corresponds to the mounting portion.

In the drawings, the word "direction" is omitted. In the drawings, the battery 200 is abbreviated as "BATT". The substrate 500 is abbreviated as "CB".

<Switch Module>

As described above, each of the U-phase leg 331, the V-phase leg 332, and the W-phase leg 333 is sealed with the resin member 360 and constitutes the switch module 340. A part of the collector terminal, not illustrated, connected to the collector electrode of the high-side switch 321 is exposed from the resin member 360. A part of the emitter terminal, not illustrated, connected to the emitter electrode of the low-side switch 322 is exposed from the resin member 360.

A part of the plurality of signal terminals 351 and a part of the plurality of measuring terminals 352 connected to the gate electrodes of the high-side switch 321 and the low-side switch 322 are exposed from the resin member 360. Note that the measuring terminal 352 corresponds to the measuring unit.

Figure 3:
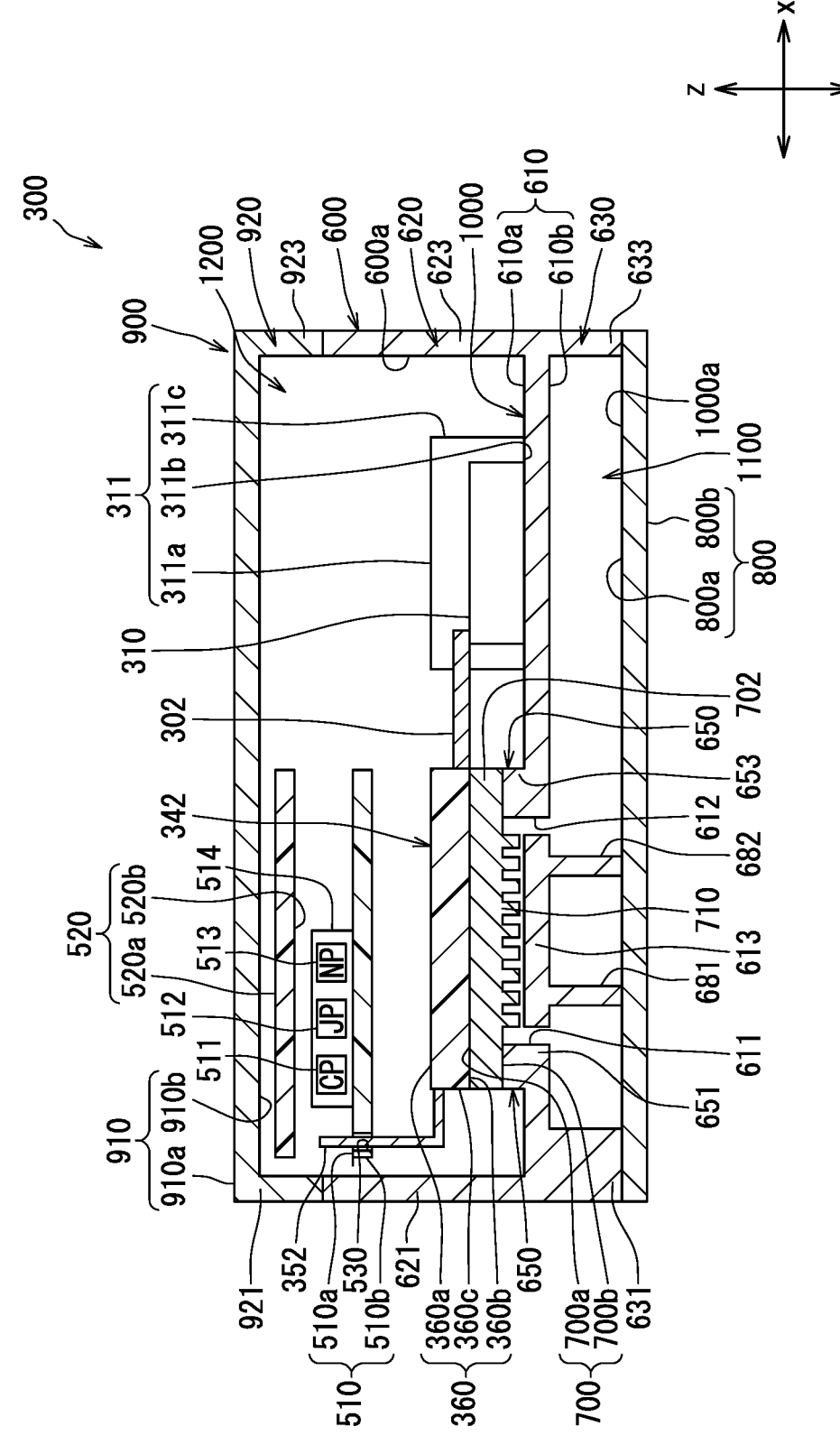
FIG. 3 is a cross-sectional view of the power control apparatus along a line III-III shown in FIG. 2.
Figure 4:
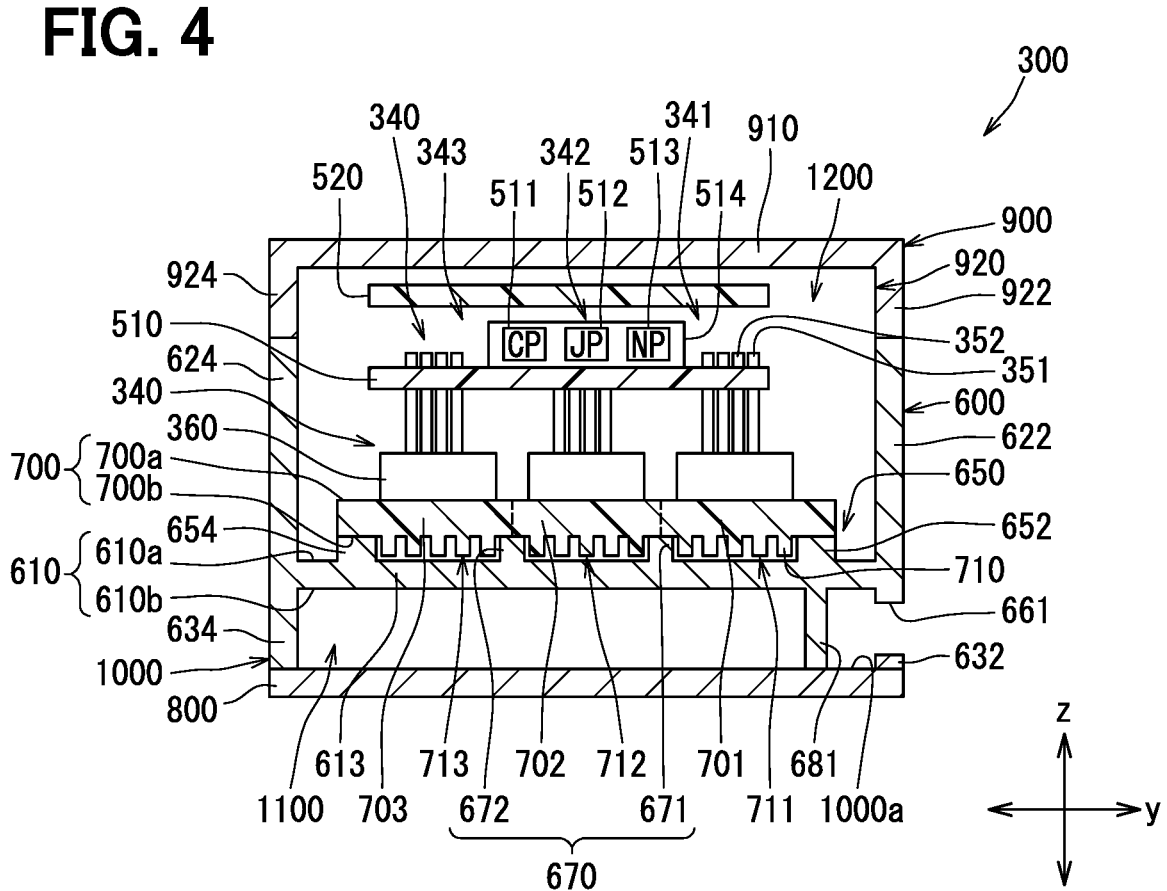
FIG. 4 is a cross-sectional view of the power control apparatus along a line IV-IV shown in FIG. 2.

As shown in FIG. 3 and FIG. 4, the resin member 360 has a flat shape with a thin thickness in the z-direction. In this aspect, z-direction may be referred to as a thickness direction. The resin member 360 has a first resin surface 360*a*, and a second resin surface 360*b* on the back side thereof, which are aligned in a spaced apart manner in the z-direction. The resin member 360 further has a connecting resin surface 360*c* connecting these two surfaces.

A part of each of the plurality of signal terminals 351 and the plurality of measuring terminals 352 is exposed from one of the connecting resin surfaces 360*c*. The plurality of signal terminals 351 and the plurality of measuring terminals 352 exposed from one of the connecting resin surfaces 360*c* extend in the z-direction toward the first resin surface 360*a* after extended in a manner away from the connecting resin surface 360*c* in the x-direction.

<First Power Supply Busbar and Second Power Supply Busbar>

The first power supply busbar 301 and the second power supply busbar 302 are conductive members, which are thin in the z-direction. Electric power output from the battery 200 is supplied to the capacitor 310 and the switch module 340 by the first power supply busbar 301 and the second power supply busbar 302, respectively. In the drawing, a part of each of the first power supply busbar 301 and the second power supply busbar 302 connected to the battery 200 is omitted.

<Substrate>

As shown in FIG. 3 and FIG. 4, the substrate 500 has a first substrate 510 and a second substrate 520. For example, a gate driver (not shown) is mounted on the first substrate 510. For example, an ECU (not shown) is mounted on the second substrate 520.

The first substrate 510 has a flat shape whose thickness in the z-direction is thin. The first substrate 510 has a first substrate surface 510*a* and a second substrate surface 510*b* on the back side thereof, which are aligned in a spaced apart manner in the z-direction A plurality of substrate apertures 530 are formed in the second substrate 520 to open to the first substrate surface 510*a* and the second substrate surface 510*b*.

Similarly, the second substrate 520 has a flat shape whose thickness in the z-direction is thin. The second substrate 520 has a third substrate surface 520*a* and a fourth substrate surface 520*b* on the back side thereof, which are aligned in a spaced apart manner in the z-direction A first connector (not shown) is connected to the first substrate 510. A second connector (not shown) is connected to the second substrate 520. The first connector and the second connector are connected by a cable (not shown). The first substrate 510 and the second substrate 520 are electrically and mechanically connected via the first connector, the cable and the second connector.

Although the drawings show a mode in which the substrate 500 includes two pieces of the first substrate 510 and the second substrate 520, alternatively, the substrate 500 may not include both the first substrate 510 and the second substrate 520. The substrate 500 may have only the first substrate 510. In that case, both the ECU and the gate driver are mounted on the first substrate 510.

<Capacitor Case>

The capacitor case 311 is a case for accommodating the capacitor 310. As shown in FIG. 3, the capacitor case 311 has a top surface 311*a* and a bottom surface 311*b* aligned in the z-direction, and a side surface 311*c* connecting them. The capacitor 310 is accommodated in a case cavity defined by the top surface 311*a*, the bottom surface 311*b*, and the side surface 311*c*. One end of the first power supply busbar 301 and one end of the second power supply busbar 302 are connected to the capacitor 310, respectively.

The side surface 311*c* of the capacitor case 311, located on a side to a first wall portion 621 described later, is formed with opening apertures, which open in the x-direction. The other ends of the first power supply busbar 301 and the second power supply busbar 302 are exposed from these opening apertures, respectively. The exposed other ends of the first power supply busbar 301 and the second power supply busbar 302 extend in a manner away from the capacitor case 311 in the x-direction.

<First Case>

The first case 600 is made of a member containing a metal material. As shown in FIG. 3, the first case 600 has a bottom portion 610, a first side portion 620 annularly protruding from the bottom portion 610, and a second side portion 630 annularly protruding from the bottom portion 610 in an opposite direction to the first side portion 620. Note that the bottom portion 610 corresponds to the main portion. The bottom portion 610 has an inner bottom surface 610*a* and an outer bottom surface 610*b* on the back side thereof, which are aligned in a spaced apart manner in the z-direction The first side portion 620 protrudes annularly along an edge of the inner bottom surface 610*a*. The first side portion 620 has a first wall portion 621 and a third wall portion 623 opposed and spaced apart in the x-direction and a second wall portion 622 and a fourth wall portion 624 opposed and spaced apart in the y-direction.

The first wall portion 621, the second wall portion 622, the third wall portion 623, and the fourth wall portion 624 are annularly connected in a circumferential direction around the z-direction. A distal end spaced apart from the inner bottom surface 610*a* of those four wall portions defines an opening.

The second side portion 630 protrudes annularly along an edge of the outer bottom surface 610*b* in an opposite direction to the first side portion 620. The second side portion 630 has a fifth wall portion 631 and a seventh wall portion 633 opposed and spaced apart in the x-direction and a sixth wall portion 632 and an eighth wall portion 634 opposed and spaced apart in the y-direction.

The fifth wall portion 631, the sixth wall portion 632, the seventh wall portion 633, and the eighth wall portion 634 are annularly connected in a circumferential direction around the z-direction. A distal end spaced apart from the outer bottom surface 610b of those four wall portions defines an opening.

Figure 9:
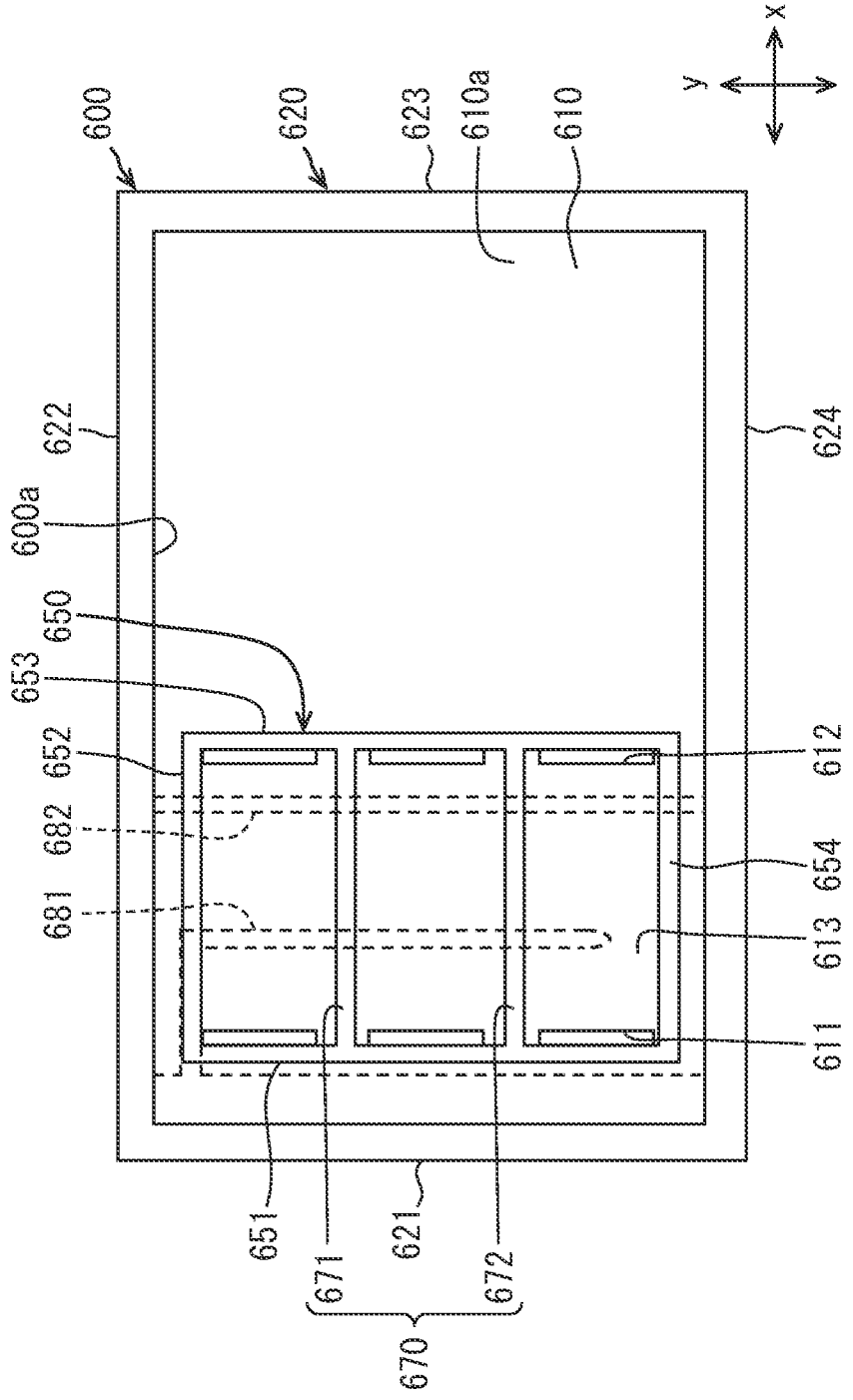
FIG. 9 is a top view of a case.

As shown in FIG. 3, the bottom portion 610 is formed with three first through holes 611 and three second through holes 612 penetrating the bottom portion 610 between the inner bottom surface 610a and the outer bottom surface 610b in the z-direction. As shown in FIG. 9, there are three first through-holes 611 and three second through holes 612. Three first through-holes 611 are aligned in a spaced apart manner in the y-direction Three second through-holes 612 are aligned in a spaced apart manner in the y-direction. Both the first through-holes 611 and the second through hole 612 are formed in a slit shape in order to provide a wide flow in the y-direction.

Three first through-holes 611 and three second through-holes 612 are aligned in a spaced apart manner in the x-direction. Three first through-holes 611 and three second through-holes 612 are located to form three pairs. Three first through holes 611 are located on a side to the first wall portion 621 and the fifth wall portion 631. Three second through holes 612 are located on a side to the third wall portion 623 and the seventh wall portion 633. Further, the bottom portion 610 is formed with a connecting portion 650. The connecting portion 650 protrudes from the inner bottom surface 610a. The connecting portion 650 provides walls to define three cavities. Three first through holes 611 and three second through holes 612 provide three pairs of through holes. In FIG. 9, a representative pair of the first through hole 611 and the second through hole 612 is indicated with numerical symbols 611 and 612. This representative pair of the first through hole 611 and the second through hole 612 is surrounded with the walls of the connecting portion 650 for defining the cavity. Both at least one of the first through holes 611 and at least one of the second through holes 612 open within one cavity. As a result, a pair of the first through hole 611 and the second through hole 612 are fluidly communicated via the cavity defined by the connecting portion 650. There are three pairs of the first through hole 611 and the second through hole 612. As a result, a plurality of parallel flow paths, actually three parallel flow paths are provided.

A first connecting portion 651 extending away from the inner bottom surface 610a in the z-direction is formed at a portion of the inner bottom surface 610a on a side closer to the first wall portion 621 than the first through holes 611.

A second connecting portion 652 extending away from the inner bottom surface 610a in the z-direction is formed at a portion of the inner bottom surface 610a on a side closer to the second wall portion 622 than the first through holes 611 and the second through holes 612 located on a side to the second wall portion 622.

A third connecting portion 653 extending away from the inner bottom surface 610a in the z-direction is formed at a portion of the inner bottom surface 610a on a side closer to the third wall portion 623 than the second through holes 612.

A fourth connecting portion 654 extending away from the inner bottom surface 610a in the z-direction is formed at a portion of the inner bottom surface 610a on a side closer to the fourth wall portion 624 than the first through holes 611 and the second through holes 612 located on a side to the fourth wall portion 624.

Both the first connecting portion 651 and the third connecting portion 653 continuously extend from a portion close to the second wall portion 622 to a portion close to the fourth wall portion 624 in the y-direction. Both the second connecting portion 652 and the fourth connecting portion 654 continuously extend from a portion close to the first wall portion 621 to a portion close to the third wall portion 623 in the x-direction. The first connecting portion 651, the second connecting portion 652, the third connecting portion 653, and the fourth connecting portion 654 are annularly connected in the circumferential direction around the z-direction.

Figure 10:
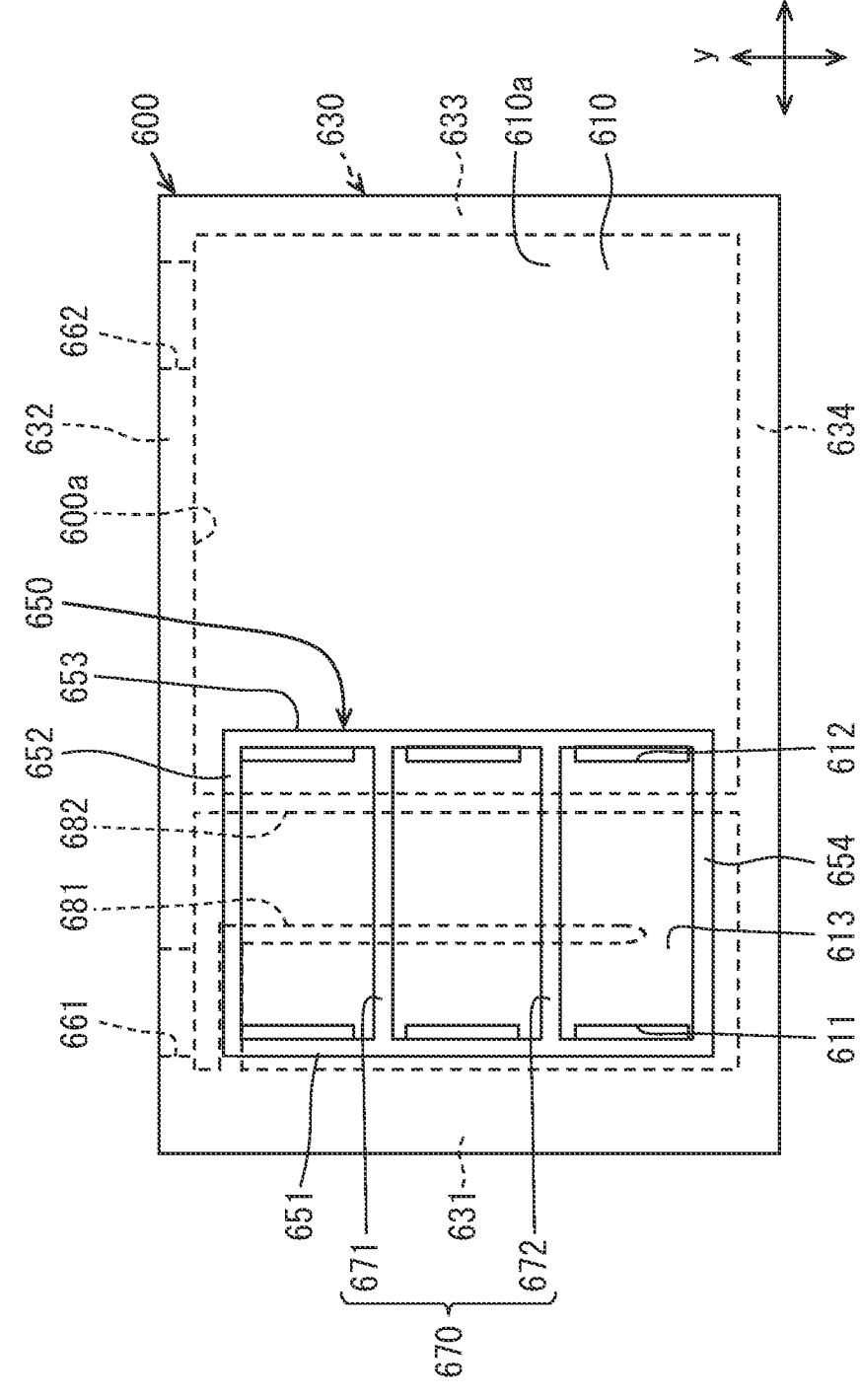
FIG. 10 is a top view, some visible lines being eliminated to show configurations for flow paths, of the case corresponding to FIG. 9.

Further, as shown in FIG. 9 and FIG. 10, the bottom portion 610 is formed with a first extension portion 681 and a second extension portion 682, which extend away from the outer bottom surface 610b in the z-direction.

Both the first extension portion 681 and the second extension portion 682 continuously extend between the eighth wall portion 634 and the sixth wall portion 632 in the y-direction. The first extension portion 681 has one end in the y-direction, which close to the eighth wall portion 634 and is aligned in a spaced apart manner in the y-direction from the eighth wall portion 634. The first extension portion 681 has the other end in the y-direction, which close to the sixth wall portion 632 and is spaced apart from the sixth wall portion 632 in the y-direction.

However, the other end of the first extension portion 681 is provided by an L-shaped bent portion which continuously extend toward the fifth wall portion 631. Therefore, the first extension portion 681 merges to the fifth wall portion 631. As a result, the first extension portion 681 continuously extend in an L-shape from the fifth wall portion 631 to the end close to the eighth wall portion 634 through under three cavities. The second extension portion 682 continuously extends to connect the eighth wall portion 634 and the sixth wall portion 632 in the y-direction. The fifth wall portion 631 is thicker than the first wall portion 621 to provide a thicker wall in the x-direction, which protrudes toward the seventh wall portion 633 as shown in FIG. 3. The end of the first extension portion 681 extending toward the fifth wall portion 631 is connected to and merged with the inner side surface 600a of the portion of the case 600 where the fifth wall portion 631 protrudes toward the seventh wall portion 633. As a result, a flow path from a supply port 661 to the first through holes 611 is fluidly communicated.

The end of the second extension portion 682 on a side to the eighth wall portion 634 is connected to and merged with the inner surface 600a of the eighth wall portion 634 of the case 600. The end of the second extension portion 682 on a side to the sixth wall portion 632 is connected to and merged with the inner surface 600a of the sixth wall portion 632 of the case 600. As a result, a flow path from the second through holes 612 to a discharge port 662 is fluidly communicated.

<Cover>

The cover 800 is made of a member containing a metal material. As shown in FIG. 3 and FIG. 4, the cover 800 has a flat shape with a thin thickness in the z-direction. The cover 800 has an inner cover surface 800a and an outer cover surface 800b on the back side thereof, which are aligned in a spaced apart manner in the z-direction.

The cover 800 is connected to a distal end of the second side portion 630 on a side away from the outer bottom surface 610b via a bolt or the like (not shown) so that the inner cover surface 800*a* opposes the outer bottom surface 610*b*. As shown in FIG. 3, distal ends of the first extension portion 681 and the second extension portion 682 on sides away from the outer bottom surface 610*b* come in contact with the inner cover surface 800*a* of the cover 800.

<Cooling Plate>

The cooling plate 700 is formed of a member containing a metal material. As shown in FIG. 3 and FIG. 4, the cooling plate 700 has a flat shape with a thin thickness in the z-direction. The cooling plate 700 has a first cooling surface 700*a* and a second cooling surface 700*b* aligned in the z-direction.

The cooling plate 700 is mounted on a distal end of each of the first connecting portion 651, the second connecting portion 652, the third connecting portion 653 and the fourth connecting portion 654 on a side away from the inner bottom surface 610*a*. The cooling plate 700 is located so that the second cooling surface 700*b* opposes the inner bottom surface 610*a* of the bottom portion 610 in the z-direction. The cooling plate 700 is connected to the first connecting portion 651, the second connecting portion 652, the third connecting portion 653 and the fourth connecting portion 65 via bolts (not shown). The cooling plate 700 is fluid tightly connected to the connecting portion 650.

The second cooling surface 700*b* of the cooling plate 700 is formed with a plurality of projection portions 710 extending away from the second cooling surface 700*b*. A detailed form of the projection portions 710 is described later.

<Cooling Portion>

The cover 800 and the cooling plate 700 are connected to the first case 600 as described above. Therefore, the cooling space 1100 through which the cooling medium flows is defined by the second side portion 630 of the first case 600, the bottom portion 610 of the first case 600, the cooling plate 700 and the cover 800. The second side portion 630, the bottom portion 610, the cooling plate 700 and the cover 800 are collectively referred to as a cooling unit 1000. Note that the cooling space 1100 corresponds to the internal space.

As shown in FIG. 4 or FIG. 10, the supply port 661 is formed at a portion of the sixth wall portion 632. The supply port 661 faces the first extension portion 681 in the y-direction. The supply port 661 opposes the L-shaped portion of the first extension portion 681 extending in the x-direction. The cooling medium is supplied from an external device to the cooling space 1100 of the cooling unit 1000 through the supply port 661.

As shown in FIG. 10, the discharge port 662 is formed at a portion of the sixth wall portion 632 between the second extension portion 682 and the seventh wall portion 633. The cooling medium is discharged outside from the cooling space 1100 of the cooling unit 1000 through the discharge port 662.

<Second Case>

The second case 900 is made of a member containing a metal material. As shown in FIG. 3 and FIG. 4, the second case 900 has an upper portion 910 and a third side portion 920 annularly protruding from the upper portion 910.

The upper portion 910 has an upper surface 910*a* and a lower surface 910*b* on the back side thereof, which are aligned in the z-direction.

The third side portion 920 protrudes annularly along an edge of the lower surface 910*b*. The third side portion 920 has a ninth wall portion 921 and an eleventh wall portion 923 opposed and spaced apart in the x-direction and a tenth wall portion 922 and a twelfth wall portion 924 opposed and spaced apart in the y-direction.

The ninth wall portion 921, the tenth wall portion 922, the eleventh wall portion 923, and the twelfth wall portion 924 are annularly connected in a circumferential direction around the z-direction. A distal end spaced apart from the lower surface 910*b* of those four wall portions defines an opening.

<Storage Space>

Figure 2:
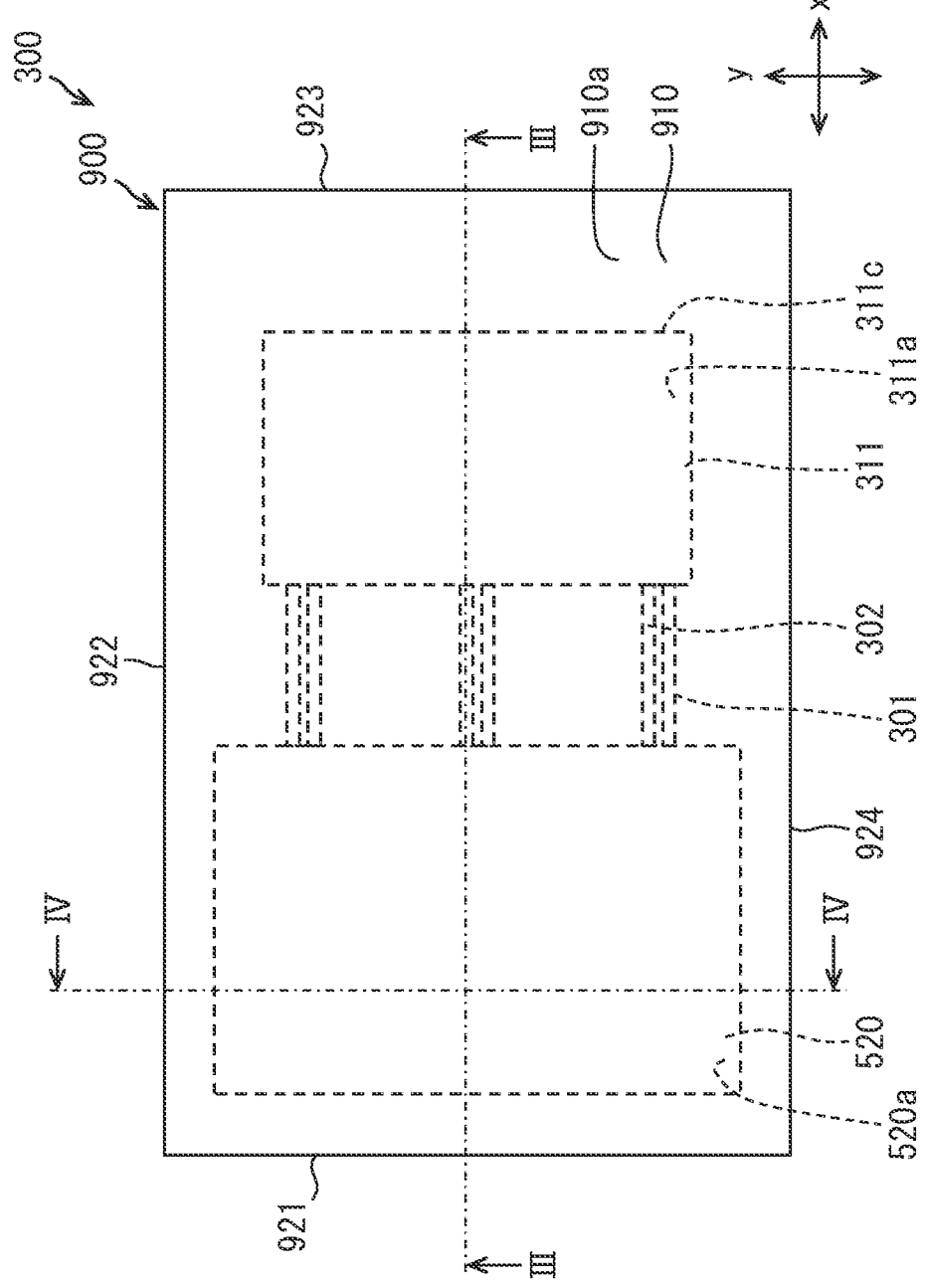
FIG. 2 is a top view illustrating a power control apparatus.

As shown in FIG. 2, FIG. 3, and FIG. 4, a distal end of the third side portion 920 spaced apart from the lower surface 910*b* is connected on a distal end of the first side portion 620 spaced apart from the inner bottom surface 610*a* via a bolt (not shown) so that the lower surface 910*b* opposes the inner bottom surface 610*a* in the z-direction. Thereby, the openings of the first case 600 and the second case 900 are closed. In this manner, a storage space 1200 is defined inside the first case 600 and the second case 900.

<Storage Configuration of Case>

The capacitor case 311, three pieces of the switch modules 340, the first power supply busbar 301, the second power supply busbar 302, the cooling plate 700 and the substrate 500 are housed in this storage space 1200.

As shown in FIG. 3 and FIG. 4, the capacitor case 311 is mounted on the inner bottom surface 610*a* of the bottom portion 610 on a side to the third wall portion 623. Three switch modules 340 are mounted on the cooling plate 700 on a side to the first cooling surface 700*a*. The cooling plate 700 is connected to a portion of the bottom portion 610 closer to the first wall portion 621 than the capacitor case 311. The capacitor case 311 and the switch module 340 are aligned in a spaced apart manner in the x-direction.

Hereinafter, the switch module 340 in which the U-phase leg 331 is resin-sealed is referred to as a U-phase switch module 341 for the sake of simplicity of explanation. The resin-encapsulated switch module 340 of the V-phase leg 332 is referred to as a V-phase switch module 342. The resin-encapsulated switch module 340 of the W-phase leg 333 is referred to as a W-phase switch module 343. Each of the U-phase switch module 341, the V-phase switch module 342 and the W-phase switch module 343 corresponds to a switch unit.

Figure 6:
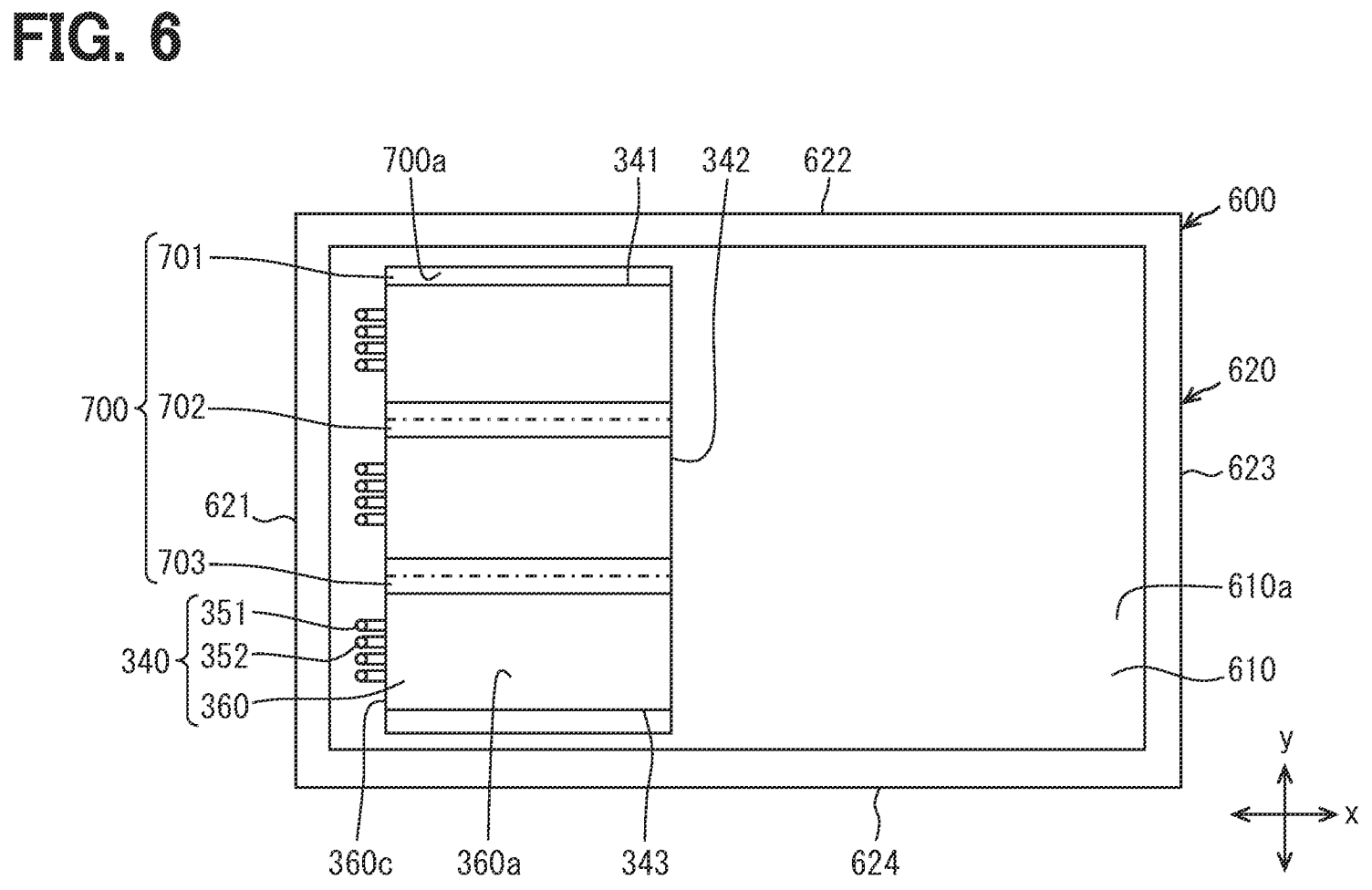

The U-phase switch module 341, the V-phase switch module 342, and the W-phase switch module 343 are mounted on a side to the first cooling surface 700*a* of the cooling plate 700, respectively. As shown in FIG. 6, the U-phase switch module 341, the V-phase switch module 342 and the W-phase switch module 343 are aligned in an order from the second wall portion 622 toward the fourth wall portion 624. Note that an aligning order of the U-phase switch module 341, the V-phase switch module 342, and the W-phase switch module 343 is not limited.

As shown in FIG. 6, a part of the plurality of signal terminals 351 and a part of the measuring terminals 352 are exposed from each of the U-phase switch module 341, the V-phase switch module 342, and the W-phase switch module 343. Each of the plurality of signal terminals 351 and the plurality of measuring terminals 352 extends in the x-direction away from the connecting resin surface 360*c* on a side to the first wall portion 621, and then extends in the z-direction away from the first resin surface 360*a*.

Figure 5:
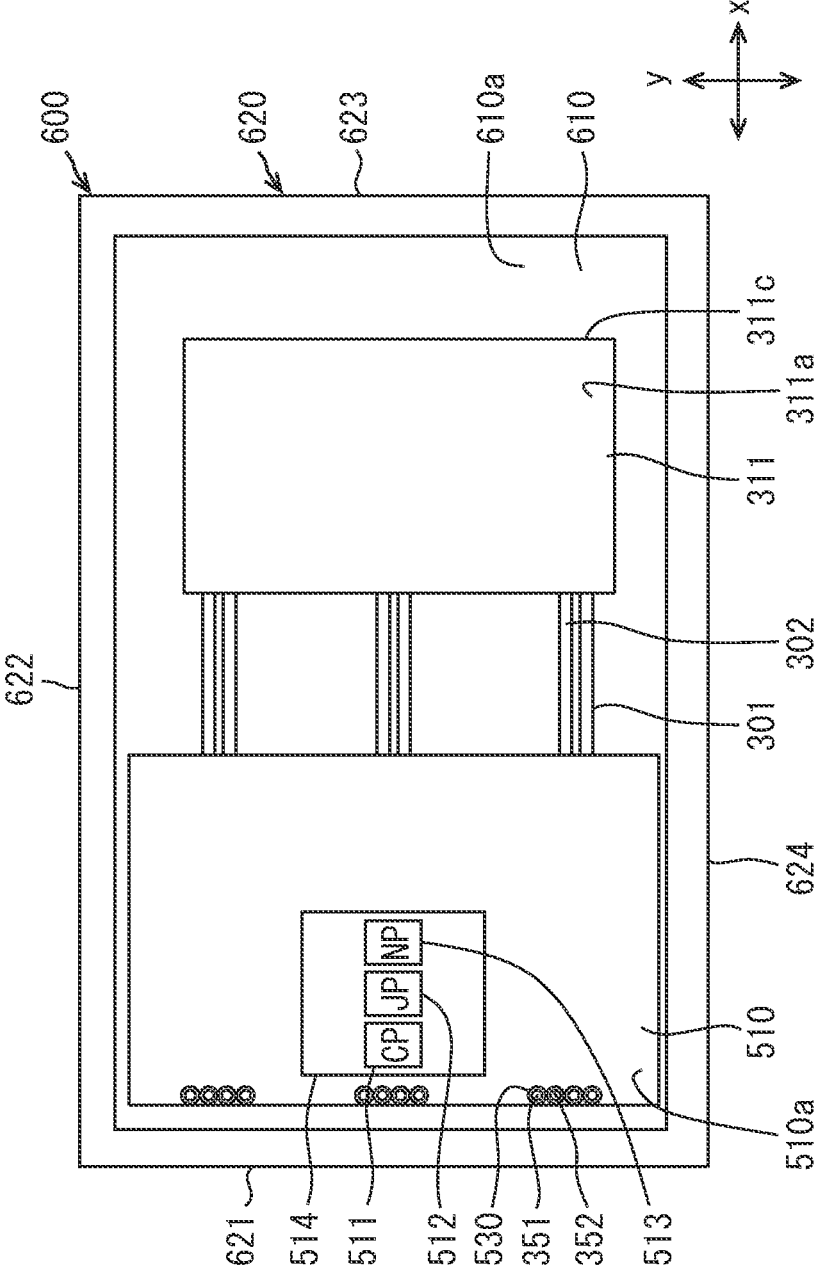
FIG. 5 is a top view of the power control apparatus shown in FIG. 2 from which a second case and a second substrate are removed.

As shown in FIG. 5, three pairs of the first power supply busbar 301 and the second power supply busbar 302 are arranged in a lateral direction of the drawing. Three pairs extend from the capacitor 310. Three pairs connect the capacitor 310 to each of the U-phase switch module 341, the V-phase switch module 342 and the W-phase switch module 343. The first power supply busbars 301 and the second power supply busbars 302 extend in the x-direction from the capacitor case 311 toward the U-phase switch module 341, the V-phase switch module 342 and the W-phase switch module 343, respectively. Each of the other ends of the first power supply busbars 301 and the second power supply busbars 302 reaches to and is connected to corresponding one of the U-phase switch module 341, the V-phase switch module 342 and the W-phase switch module 343, respectively.

A part of a collector terminal and an emitter terminal (not shown) are provided at an end of the resin member 360 on a side to the capacitor case 311. The other end of the first power supply busbar 301 is connected to the collector terminal. The other end of the second power supply busbar 302 is connected to the emitter terminal.

As shown in FIG. 3 or FIG. 4, the first substrate 510 and the second substrate 520 are provided in the storage space 1200 in a side to the upper portion 910 rather than the resin member 360 of the U-phase switch module 341, the V-phase switch module 342 and the W-phase switch module 343, respectively. The first substrate 510 and the second substrate 520 are aligned in a spaced apart manner in the z-direction. The first substrate 510 is located closer to the resin member 360 than the second substrate 520. The first substrate 510 is connected to the first case 600 by a bolt or the like (not shown). The second substrate 520 is connected to the second case 900 by a bolt or the like (not shown).

A plurality of substrate apertures 530 are formed in the first substrate 510 to open to the first substrate surface 510*a* and the second substrate surface 510*b*. The plurality of substrate apertures 530 are aligned in a line in the y-direction at an end on a side of the first wall portion 621.

The plurality of signal terminals 351 and the plurality of measuring terminals 352 are placed to pass through the substrate apertures 530. The plurality of signal terminals 351 and the plurality of measuring terminals 352 placed to pass through the plurality of substrate apertures 530 are electrically and mechanically connected to the first substrate 510 by solder or the like (not shown).

The plurality of signal terminals 351 serve as functions of paths for transmitting/receiving electrical signals between the legs (the U-phase leg 331, the V-phase leg 332, and the W-phase leg 333) and the gate driver. A plurality of measuring terminals 352 serve as temperature sensors for measuring temperatures of the U-phase leg 331, the V-phase leg 332, and the W-phase leg 333, respectively.

In addition to the gate driver, the first substrate 510 also has a composite unit 514 mounted thereon. The composite unit 514 may be provided by an electronic control circuit. The control circuit includes at least one processor circuit. One example of a processor circuit is a processor circuit that executes a program which is an assembled instructions executable by a computer. The processor circuit may be so-called a microprocessor and may be provided as a chip. The controller includes a program and a non-transitory, tangible storage medium, e.g., a semi-conductor memory, for recording data. The processor circuit provides functions of the device according to this disclosure by executing a program. Another example of a processor circuit is a processor circuit including a plurality of logic circuits or analog circuits. A plurality of logic circuits or analog circuits are configured to provide a plurality of substantive elements and their electrical connections so as to provide functions of the apparatus according to this disclosure. The processor circuit may have various names such as accelerators, gate arrays, and FPGAs (Field-programmable gate arrays). The controller is also called a microcontroller or a microcomputer. The controller, having at least one processor circuit, is configured to perform as at least one unit, module, or section described in this disclosure. The composite unit 514 has a comparison unit 511, a determination unit 512, and a notification unit 513 as functional blocks. In the drawing, the comparison unit 511 is abbreviated as "CP". The determination unit 512 is abbreviated as "JP". The notification unit 513 is abbreviated as "NP".

The comparison unit 511 has a function of comparing each of the temperatures of the U-phase leg 331, the V-phase leg 332, and the W-phase leg 333 measured by the measuring terminals 352.

The determination unit 512 has a function of determining whether or not each of the temperature differences between two legs out of the U-phase leg 331, the V-phase leg 332, and the W-phase leg 333 is greater than or equal to a threshold value, based on information from the comparison unit 511.

The threshold value is at least a value greater than or equal to a temperature difference caused by product errors in the U-phase leg 331, the V-phase leg 332, and the W-phase leg 333.

The temperature of one of the two legs whose temperature difference is greater than or equal to the threshold value is further greater than a predetermined multiple value of the temperature of the remaining one leg.

Specifically speaking, the predetermined multiple value is about 1.5 times. Note that the predetermined multiple value is not limited to 1.5 times and can be arbitrarily set depending on the design.

The notification unit 513 has a function of notifying the vehicle of an abnormality if the determination unit 512 determines that any one of the temperature differences between two legs out of the U-phase leg 331, the V-phase leg 332, and the W-phase leg 333 is greater than or equal to a threshold value. Based on the information, for example, a warning light mounted on a meter panel provided in the vehicle is displayed.

Note that the composite unit 514 does not have to be mounted on the first substrate 510. In that case, the composite unit 514 may be mounted on the second substrate 520.

<Switch Module and Cooling Plate>

The U-phase switch module 341, the V-phase switch module 342, and the W-phase switch module 343 are mounted on a side to the first cooling surface 700*a* of the cooling plate 700, respectively.

As shown in FIG. 6, the U-phase switch module 341 is mounted on a part of the first cooling surface 700*a* of the cooling plate 700 corresponding the U-phase mounting portion 701 which is a part located on a side to the second wall portion 622. The W-phase switch module 343 is mounted on a part of the first cooling surface 700*a* of the cooling plate 700 corresponding the W-phase mounting portion 703 which is a part located on a side to the fourth wall portion 624. The V-phase switch module 342 is mounted on a part of the first cooling surface 700*a* of the cooling plate 700 corresponding the V-phase mounting portion 702 which is a part located between the U-phase mounting portion 701 and the W-phase mounting portion 703. In the drawing, boundaries of the U-phase mounting portion 701, the V-phase mounting portion 702, and the W-phase mounting portion 703 are indicated by dashed lines.

Figure 8:
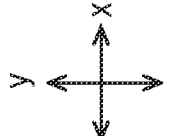
FIG. 8 is a plan view for explaining a cooling plate.
Figure 8:
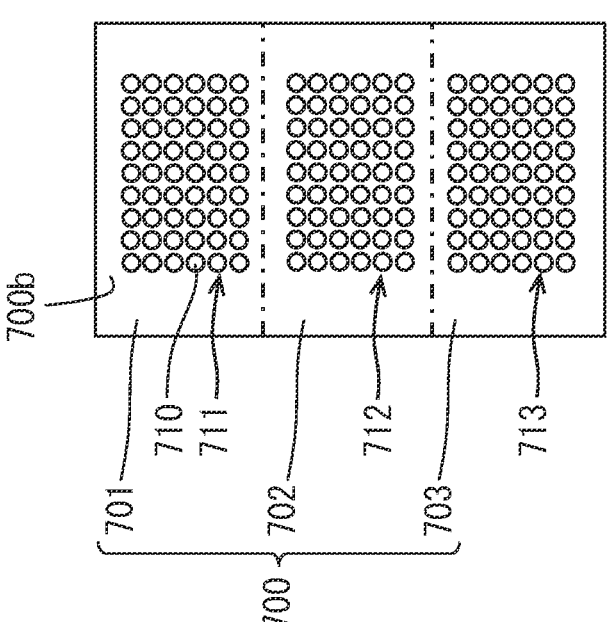

A plurality of projection portions 710 extending away from the second cooling surface 700*b* in the z-direction are formed on the second cooling surface 700*b* of each of the U-phase mounting portion 701, the V-phase mounting portion 702, and the W-phase mounting portion 703. As shown in FIG. 4 and FIG. 8, the plurality of projection portions 710 are columnar shapes. Note that the shape of the plurality of projection portions 710 is not limited to the columnar shape. For example, the plurality of projection portions 710 may have a prismatic shape.

As shown in FIG. 8, a U-phase projection group 711 including a plurality of projection portions 710 is formed on the second cooling surface 700*b* of the U-phase mounting portion 701. AV-phase projection group 712 including a plurality of projection portions 710 is formed on the second cooling surface 700*b* of the V-phase mounting portion 702. A W-phase projection group 713 including a plurality of projection portions 710 is formed on the second cooling surface 700*b* of the W-phase mounting portion 703.

The U-phase protruding group 711 and the V-phase protruding group 712 are aligned in a spaced apart manner in the y-direction. The W-phase protruding group 713 and the V-phase protruding group 712 are aligned in a spaced apart manner in the y-direction.

A plurality of projection portions 710 included in each of the U-phase projection group 711, the V-phase projection group 712 and the W-phase projection group 713 are aligned in a spaced apart manner in the x-direction and the y-direction.

Two adjacent ones of the plurality of projection portions 710 included in the U-phase projection group 711, the V-phase projection group 712 and the W-phase projection group 713 are distanced equal to or larger than a projections separation distance in the y-direction. The projections separation distance is set shorter than both a span length in the x-direction and a span length in the y-direction on an x-y plane of the projection portion 710.

The projections separation distance is set shorter than a thickness of the cooling plate 700 in the z-direction between the first cooling surface 700*a* and the second cooling surface 700*b*.

As described in FIG. 3, the plurality of projection portions 710 included in the U-phase projection group 711, the V-phase projection group 712 and the W-phase projection group 713 are arranged to define a projections separation distance in the y-direction. The projections separation distance is shorter than a distance between the second connecting portion 652 and the first protruding portion 671 in the y-direction. The projections separation distance is shorter than a distance between the first protruding portion 671 and the second protruding portion 672 in the y-direction. The projections separation distance is shorter than a distance between the second protruding portion 672 and the fourth connecting portion 654 in the y-direction. As a result, the plurality of projections 710 are arranged to define a projections separation distance between adjacent two of the projections 710 in the aligning direction (the y-direction). The projections separation distance is shorter than at least one of distances (i), (ii), and (iii). (i) A distance between one protruding portion 671 located on the one end in the aligning direction out of the plurality of the protruding portions 671 and 672 and the connecting portion 652 located on the one end in the aligning direction. (ii) A distance between two of the protruding portions 671 and 672 located on next by next in the aligning direction out of the plurality of the protruding portions 671 and 672. (iii) A distance between one protruding portion 672 located on the other end in the aligning direction out of the plurality of the protruding portions 671 and 672 and the connecting portion 654 located on the other end in the aligning direction. In the embodiment, the projections separation distance is shorter than the distances (i), (ii), and (iii).

Note that the U-phase projection group 711, the V-phase projection group 712, and the W-phase projection group 713 may not be formed on the cooling plate 700. The U-phase projection group 711, the V-phase projection group 712, and the W-phase projection group 713 and the cooling plate 700 may be provided by separate members. In that case, the U-phase projection group 711, the V-phase projection group 712, the W-phase projection group 713 and the cooling plate 700 may be mechanically connected.

<First Protruding Portion and Second Protruding Portion>

As shown in FIG. 4, the first protruding portion 671 and the second protruding portion 672 protruding toward the cooling plate 700 as the protruding portion 670 are formed at portions of the bottom portion 610 opposing the second cooling surface 700*b* in the z-direction between the first connecting portion 651 and the third connecting portion 653. As described above, the U-phase projection group 711, the V-phase projection group 712, and the W-phase projection group 713 are formed on the cooling plate 700 on a side of the second cooling surface 700*b*.

Figure 7:
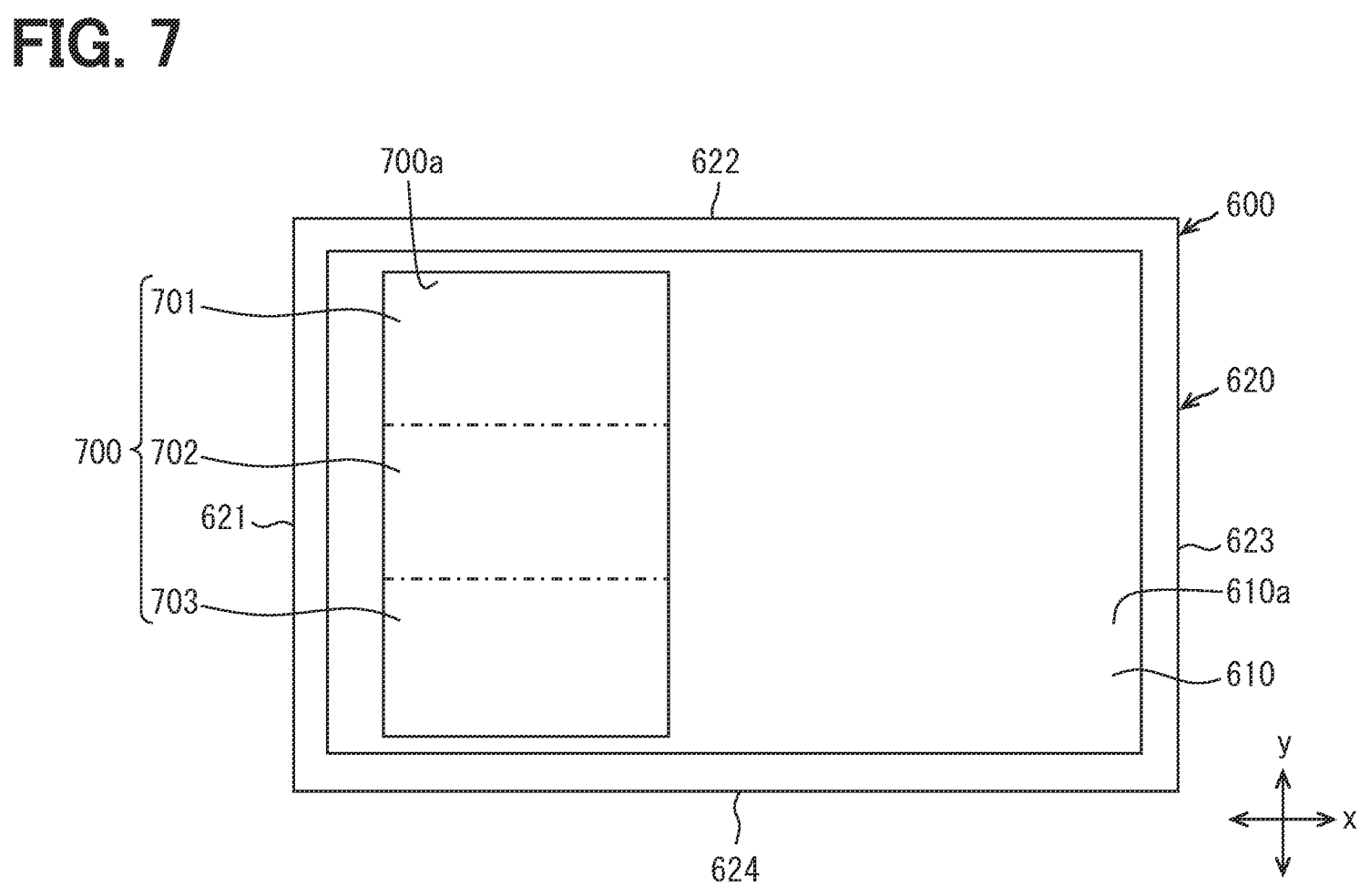

As shown in FIG. 7, the first protruding portion 671 is located between the U-phase projection group 711 and the V-phase projection group 712 in the y-direction. The second protruding portion 672 is located between the V-phase projection group 712 and the W-phase projection group 713 in the y-direction. Naturally, the first protruding portion 671 is located between the U-phase mounting portion 701 and the V-phase mounting portion 702. The second protruding portion 672 is located between the V-phase mounting portion 702 and the W-phase mounting portion 703. In order to simplify the description, a portion of the bottom portion 610 that opposes the second cooling surface 700*b* in the z-direction between the first connecting portion 651 and the third connecting portion 653 in the x-direction is referred to as an opposing portion 613.

The first protruding portion 671 and the second protruding portion 672 described above may not be formed on the opposing portion 613. The first protruding portion 671 and the second protruding portion 672 may be separate parts from the opposing portion 613. In that case, the first protruding portion 671 and the second protruding portion 672 may be mechanically connected to the opposing portion 613.

Further, as shown in FIG. 9, each of the first protruding portion 671 and the second protruding portion 672 extends in the x-direction. Each one of ends of the first protruding portion 671 and the second protruding portion 672 on a side of the first connecting portion 651 is connected to the first connecting portion 651. Each one of the other ends of the first protruding portion 671 and the second protruding portion 672 on a side of the third connecting portion 653 is connected to the third connecting portion 653.

The end of each of the first protruding portion 671 and the second protruding portion 672 on the side of the first connecting portion 651 does not have to be connected to the first connecting portion 651. The ends of the first protruding portion 671 and the second protruding portion 672 on the side of the third connecting portion 653 may not be connected to the third connecting portion 653.

As shown in FIG. 4, distal ends of the first protruding portion 671 and the second protruding portion 672 on a side of the cooling plate 700 are in contact with the second cooling surface 700*b*. Note that the distal ends of the first protruding portion 671 and the second protruding portion 672 on the side of the cooling plate 700 do not have to be in contact with the second cooling surface 700*b*.

<Cooling Medium Flow in Cooling Space>

If the cooling medium is supplied from the external device, such as a cooling device, to the cooling space 1100 through the supply port 661, the cooling medium first moves through the cooling space 1100 between the first extension portion 681 and the second extension portion 682 through the sixth wall portion 632 to the eighth wall portion 634.

The cooling medium flows to a side of the eighth wall portion 634 in the cooling space 1100 between the first extension portion 681 and the second extension portion 682, then flows the cooling space 1100 on a side of the eighth wall portion 634 in a direction from a side of the seventh wall portion 633 toward a side of the fifth wall portion 631. Then, the cooling medium flows the cooling space 1100, first in one direction toward a side of the eighth wall portion 634, then flows toward a side of the fifth wall portion 631 to change a direction, further flows the cooling space 1100 between the first extension portion 681 and the fifth wall portion 631 in the other opposite direction from the eighth wall portion 634 toward the sixth wall portion 632.

An end part of the first extension portion 681 on a side of the sixth wall portion 632 is an L-shape which extends in the x-direction toward the fifth wall portion 631. The end of the first extension portion 681 on a side to the fifth wall portion 631 is connected to and merged with the inner surface 600a of the fifth wall portion 631 of the case 600. Therefore, the cooling medium flowing from the eighth wall portion 634 toward the sixth wall portion 632 in the cooling space 1100 between the first extension portion 681 and the fifth wall portion 631 does not flow to the supply port 661 again.

Further, as described above, the bottom portion 610 is formed with the first through holes 611 and the second through holes 612 penetrating the bottom portion 610 between the inner bottom surface 610a and the outer bottom surface 610b in the z-direction. Each of three first through holes 611 is located closer to a side of the fifth wall portion 631 than a portion of the first extension portion 681 extending in the y-direction. Each of three second through holes 612 is located closer to a side of the seventh wall portion 633 than the second extension portion 682.

The cooling medium flows through the cooling space 1100 between the first extension portion 681 and the fifth wall portion 631 in a direction from the eighth wall portion 634 toward the sixth wall portion 632 and flows to pass through three first through holes 611 from a side of the bottom surface 610b to a side of the inner bottom surface 610a.

A part of the cooling medium enters one of the first through holes 611 on a side of the eighth wall portion 634 among three first through holes 611, and then, is supplied to a part of the cooling space 1100 between the opposing portion 613 and the W-phase mounting portion 703. After that, the cooling medium enters one of the second through holes 612 on a side of the eighth wall portion 634 among the three second through holes 612, and then, is supplied to a part of the cooling space 1100 between the second extension portion 682 and the seventh wall portion 633. The cooling medium is then discharged to the discharge port 662.

Similarly, the cooling medium enters a middle one of the first through holes 611 between the eighth wall portion 634 and the sixth wall portion 632, then is supplied to a part of the cooling space 1100 between the opposing portion 613 and the V-phase mounting portion 702. After that, the cooling medium enters a middle one of the second through holes 612 between the eighth wall portion 634 and the sixth wall portion 632, and then, is supplied to a part of the cooling space 1100 between the second extension portion

682 and the seventh wall portion 633. The cooling medium is then discharged to the discharge port 662.

Similarly, the cooling medium enters one of the first through holes 611 on a side of the sixth wall portion 632, then is supplied to a part of the cooling space 1100 between the opposing portion 613 and the U-phase mounting portion 701. After that, the cooling medium enters one of the second through holes 612 on a side of the sixth wall portion 632 among the three second through holes 612, and then, is supplied to a part of the cooling space 1100 between the second extension portion 682 and the seventh wall portion 633. The cooling medium is then discharged to the discharge port 662.

Therefore, the U-phase switch module 341 mounted on the U-phase mounting portion 701 is cooled by the cooling medium flowing in the x-direction in the part of the cooling space 1100 between the opposing portion 613 and the U-phase mounting portion 701. The x-direction is a direction orthogonal to the y-direction where the U-phase switch modules 341, the V-phase switch modules 342, and the W-phase switch modules 343 are aligned. The V-phase switch module 342 mounted on the V-phase mounting portion 702 is cooled by the cooling medium flowing in the x-direction in the part of the cooling space 1100 between the opposing portion 613 and the V-phase mounting portion 702. The W-phase switch module 343 mounted on the W-phase mounting portion 703 is cooled by the cooling medium flowing in the x-direction in the part of the cooling space 1100 between the opposing portion 613 and the W-phase mounting portion 703.

In other words, the U-phase leg 331 is cooled by the cooling medium flowing between the first protruding portion 671 and the first connecting portion 651 in the cooling space 1100. The V-phase leg 332 is cooled by the cooling medium flowing between the first protruding portion 671 and the second protruding portion 672 in the cooling space 1100. The W-phase leg 333 is cooled by the cooling medium flowing between the second protruding portion 672 and the third connecting portion 653 in the cooling space 1100. Thus, the U-phase leg 331, the V-phase leg 332, and the W-phase leg 333 are individually cooled.

Also, the condenser 310 is cooled by the cooling medium flowing in the cooling space 1100 between the second extension portion 682 and the seventh wall portion 633.

<Corrosion Products and Refrigerant>

As described above, the first case 600, the cooling plate 700, and the cover 800 are made of members containing a metal material. A part of the first case 600, the cooling plate 700 and the cover 800 provide the cooling unit 1000.

If the cooling medium flows through the cooling space 1100, the cooling inner surface 1000a of the cooling space 1100 is likely to corrode. If the cooling inner surface 1000a corrodes, for example, a corrosion product may be formed. The corrosion product is formed by a combination of a part of the component of the cooling unit 1000 dissolved in the cooling medium and a part of the component of the cooling medium. The corrosion product may be deposited on the cooling inner surface 1000a.

If the corrosion products accumulate at any location in the cooling space 1100, a flow areas for the cooling medium may be narrowed and the cooling medium may be difficult to flow to the location where the corrosion products have accumulated. As a result, the cooling medium is more likely to actively flow into areas of the cooling space 1100 where the corrosion products are not deposited.

Therefore, there may be a possibility that a difference of the cooling efficiencies may occur between the cooling efficiency of the leg aligned with the cooling medium in the z-direction at a location where the corrosion products are deposited and the cooling efficiency of the leg aligned with the cooling medium in the z-direction at a location where the corrosion product is not deposited. This may cause variations in temperatures of the legs.

Further, even if there is a difference in thermal resistances between each of the plurality of legs and the cooling unit 1000, temperatures of the plurality of legs also varies. Even if an abnormality occurs in some of the plurality of legs, temperatures of the plurality of legs varies.

<Refrigerant Flow Direction and Temperature Difference>

However, depending on an aligning direction of the plurality of switch modules 340 with respect to the flow direction of the refrigerant, variations in temperatures of the plurality of legs may occur even if the above abnormality does not occur.

For example, if the aligning direction of the plurality of switch modules 340 and the flow direction of the refrigerant are the same, the refrigerant heat-exchanged with a part of the plurality of legs exchanges heat with the other legs. Therefore, a difference occurs in temperatures of the plurality of legs.

Thus, even if there is no temperature abnormality in each of the plurality of legs, a difference in temperature occurs between the plurality of legs. Therefore, if the aligning direction of the plurality of switch modules 340 and the flow direction of the refrigerant are the same, it is difficult to determine whether the leg temperature is abnormal.

Operations and Advantages

As described above, the U-phase leg 331, the V-phase leg 332 and the W-phase leg 333 are cooled by the cooling medium flowing through passages of the cooling space 1100 between the opposing portions 613 and the cooling plate 700. Furthermore, the cooling medium cools the U-phase leg 331, the V-phase leg 332 and the W-phase leg 333 by flowing in the x-direction perpendicular to the y-direction in which the U-phase switch module 341, the V-phase switch module 342 and the W-phase switch module 343 are aligned.

Therefore, if no temperature abnormality occurs in the U-phase leg 331, the V-phase leg 332, and the W-phase leg 333, respectively, temperature differences between two temperatures of the U-phase leg 331, the V-phase leg 332, and the W-phase leg 333 is expected to be minute. That is, it is expected that the temperature differences between two legs among the U-phase leg 331, the V-phase leg 332, and the W-phase leg 333 is lower than the threshold.

However, if the cooling medium flow is locally impeded due to the accumulation of the corrosion products as described above, a temperature difference between two legs out of the U-phase leg 331, the V-phase leg 332 and the W-phase leg 333 becomes greater than or equal to the threshold value. In addition, a temperature difference between two legs may become greater than or equal to the threshold value in some specific situations such that if there is a difference in thermal resistances between the cooling unit 1000 and each of the U-phase leg 331, the V-phase leg 332, and the W-phase leg 333, or if an abnormality occurs in some of the U-phase leg 331, the V-phase leg 332, and the W-phase leg 333. That is, if a temperature difference between two legs out of the U-phase leg 331, the V-phase leg 332, and the W-phase leg 333 is greater than or equal to the threshold value, it may be concerned that a part of the U-phase leg 331, the V-phase leg 332, and the W-phase leg 333 has an abnormality in temperature.

As described above, the determination unit 512 has a function of determining whether or not each of the temperature differences between two legs out of the U-phase leg 331, the V-phase leg 332, and the W-phase leg 333 is greater than or equal to the threshold value based on the information from the comparison unit 511. Therefore, it is possible to determine whether or not a part of the U-phase leg 331, the V-phase leg 332, and the W-phase leg 333 has a temperature abnormality.

As described above, the protruding portion 670 including the first protruding portion 671 and the second protruding portion 672 are formed on the opposing portions 613 to protrude toward the cooling plate 700. The U-phase leg 331, the V-phase leg 332 and the W-phase leg 333 are separately and individually cooled by the cooling medium flowing in corresponding passages of the cooling space 1100. The cooling space 1100 provides three corresponding passages. The passages include a passage between the first protruding portion 671 and the second connecting portion 652, a passage between the first protruding portion 671 and the second protruding portion 672, and a passage between the second protruding portion 672 and the fourth connecting portion 654. As a result, each of the plurality of switch units 341, 342, and 343 is individually cooled by the cooling medium supplied to three passages in the internal space (the cooling space 1100). One of there passages is formed (i) between one protruding portion 671 located on an end in the aligning direction (the y-direction) out of the plurality of the protruding portions 671 and 672 and the connecting portion 652 located on the one end in the aligning direction. One of there passages is formed (ii) between two of the protruding portions 671 and 672 located on next by next in the aligning direction out of the plurality of the protruding portions 671 and 672. One of there passages is formed (iii) between one protruding portion 672 located on the other end in the aligning direction out of the plurality of the protruding portions 671 and 672 and the connecting portion 654 located on the other end in the aligning direction.

Therefore, the refrigerant that has performed a heat exchange with some of the multiple legs is suppressed from additionally performing a heat exchanging with the remaining legs. Therefore, it is easy to determine whether or not some of the U-phase leg 331, the V-phase leg 332 and the W-phase leg 333 have a temperature abnormality.

As described above, the second cooling surface 700b of the cooling plate 700 is formed with a plurality of projection portions 710 extending away from the second cooling surface 700b. If a plurality of projection portions 710 are formed in each of the U-phase mounting portion 701, the V-phase mounting portion 702 and the W-phase mounting portion 703, surface area of each of the U-phase mounting portion 701, the V-phase mounting portion 702 and the W-phase mounting portion 703 increases. Therefore, the corrosion products tend to accumulate on each of the U-phase mounting portion 701, the V-phase mounting portion 702, and the W-phase mounting portion 703. Specifically, the corrosion products are likely to deposit on the U-phase projection group 711, the V-phase projection group 712, and the W-phase projection group 713.

Further, if a plurality of projection portions 710 are connected to the second cooling surfaces 700b of the U-phase mounting portion 701, the V-phase mounting portion 702, and the W-phase mounting portion 703, respectively, a surface area of the cooling inner surface 1000a defining the cooling space 1100 increases. The corrosion products tend to accumulate on the cooling inner surface 1000a that defines the cooling space 1100.

Therefore, the cooling medium may become difficult to flow through the areas where the corrosion products are deposited in the cooling space 1100. As a result, the cooling medium is more likely to actively flow into the remaining portions of the cooling space 1100 where the corrosion products are not deposited.

A difference between a temperature of the leg aligned in the z-direction where the corrosion products are deposited and a temperature of the leg aligned in the z-direction where the corrosion products are not deposited tends to increase positively. A temperature difference between a temperature of the leg aligned in the z-direction where the corrosion products are deposited and a temperature of the leg aligned in the z-direction where the corrosion products are not deposited tends to be greater than or equal to the threshold value. Therefore, the determination unit 512 can quickly determine whether or not there is an abnormality in a temperature of each of the plurality of legs.

As described above, two adjacent ones of the plurality of projection portions 710 included in the U-phase projection group 711, the V-phase projection group 712 and the W-phase projection group 713 are distanced equal to or larger than a projections separation distance in the y-direction. The projections separation distance is shorter than a distance between the second connecting portion 652 and the first protruding portion 671 in the y-direction. The projections separation distance is shorter than a distance between the first protruding portion 671 and the second protruding portion 672 in the y-direction. The projections separation distance is shorter than a distance between the second protruding portion 672 and the fourth connecting portion 654 in the y-direction.

Therefore, the corrosion products may be easily held between two adjacent ones of the plurality of projections 710 in the y-direction.

A difference between a temperature of the leg aligned in the z-direction where the corrosion products are deposited and a temperature of the leg aligned in the z-direction where the corrosion products are not deposited tends to increase positively. The determination unit 512 can quickly determine whether or not there is an abnormality in a temperature of each of the plurality of legs.

As described above, the projections separation distance is set shorter than a thickness of the cooling plate 700 in the z-direction between the first cooling surface 700a and the second cooling surface 700b. Therefore, the corrosion products may be easily held between two adjacent ones of the plurality of projections 710 in the y-direction.

As described above, the projections separation distance is set shorter than both a span length in the x-direction and a span length in the y-direction on an x-y plane. Therefore, the corrosion products may be easily held between two adjacent ones of the plurality of projections 710 in the y-direction.

As described above, the notification unit 513 serves as a functions of activating a warning light mounted on a meter panel if the determination unit 512 determines that any one of the temperature differences between two legs out of the U-phase leg 331, the V-phase leg 332, and the W-phase leg 333 is greater than or equal to the threshold value. Therefore, the user can recognize whether or not there is an abnormality in the temperature of each of the multiple legs.

First Modification

Although not shown, the protruding portion 670 may not be mechanically connected to the opposing portion 613. The cooling medium at least cools the U-phase leg 331, the V-phase leg 332 and the W-phase leg 333, respectively, by flowing in the x-direction perpendicular to the y-direction in which the U-phase switch module 341, the V-phase switch module 342 and the W-phase switch module 343 are aligned.

Second Modification

Although not shown, the protruding portion 670 may be mechanically connected to the second cooling surface 700b of the cooling plate 700. In that case, a distance in the z-direction between the protruding portion 670 and the opposing portion 613 should be shorter than a length of the projection portion 710 in the z-direction.

Third Modification

In the embodiments described so far, the composite unit 514 is mounted on the substrate 500. However, the composite unit 514 may be mounted on a substrate that is controlled at a higher level than the substrate 500.

Other Modifications

In this embodiment, an example in which the power control apparatus 300 is included in the in-vehicle system 100 for an electric vehicle is shown. However, the application of the power control apparatus 300 is not particularly limited to the above example. For example, a configuration in which the power control apparatus 300 is included in a system of a hybrid vehicle having a motor 400 and an internal combustion engine may also be adopted.

In this embodiment, an example in which one motor 400 is connected to the power control apparatus 300 is shown. Alternatively, a configuration in which a plurality of motors 400 are connected to the power control apparatus 300 may also be adopted. In this case, the power control apparatus 300 has a plurality of three-phase switch module 340 for configuring the inverter.

What is claimed is:

1. A power control apparatus, comprising:
a plurality of switch units;
a cooling unit which supports a plurality of switch units and cools each of the plurality of switch units with a cooling medium which is supplied to flow in an internal space in one direction orthogonal to a direction in which the plurality of switch units are aligned in an aligning direction; and an electronic control circuit, wherein
the electronic control circuit is configured to perform:
measuring temperatures of each of the plurality of switch units;
comparing the temperatures of each of the plurality of switch units measured by the measuring step; and
determining whether a temperature difference between any two of the plurality of switch units is greater than or equal to a threshold value based on information from the comparing step, and wherein
the cooling unit includes:
a mounting portion on which the plurality of switch units are mounted; and
a main portion, on which the mounting portion is mounted, and which partitions a part of the internal space together with the mounting portion, and wherein
the main portion includes:
an opposing portion which opposes the mounting portion in an orthogonal direction which is orthogonal to the aligning direction and the one direction;
a connecting portion which protrudes from the opposing portion toward the mounting portion in an annular shape and the mounting portion is connected on a distal end thereof; and
a plurality of protruding portions protruding from a portion surrounded with the connecting portion in the opposing portion and aligned in a spaced apart manner in the aligning direction, and wherein each of the plurality of switch units is individually cooled by a cooling medium supplied to three passages in the internal space, the passages being formed (i) between one protruding portion located on an end in the aligning direction out of the plurality of protruding portions and the connecting portion located on the one end in the aligning direction, (ii) between two of the protruding portions located on next by next in the aligning direction out of the plurality of protruding portions, and (iii) between one protruding portion located on the other end in the aligning direction out of the plurality of protruding portions and the connecting portion located on the other end in the aligning direction, and wherein the threshold value in the determining step performed by the electronic control circuit is adjusted so that a temperature difference between a temperature of one of the switch units cooled by one of the three passages where corrosion products are deposited and a temperature of another one of the switch units cooled by another one of the three passages where the corrosion products are not deposited is greater than or equal to the threshold value.

2. The power control apparatus according to claim 1, wherein the mounting portion is connected with a plurality of projection portions projecting toward the opposing portion.

3. The power control apparatus according to claim 2, wherein the plurality of projection portions are arranged to define a projections separation distance between adjacent two of the projection portions in the aligning direction, the projections separation distance being shorter than at least one of distances in the aligning direction (i) between one protruding portion located on the one end in the aligning direction out of the plurality of protruding portions and the connecting portion located on the one end in the aligning direction, (ii) between two of the protruding portions located on next by next in the aligning direction out of the plurality of protruding portions, and (iii) between one protruding portion located on the other end in the aligning direction out of the plurality of protruding portions and the connecting portion located on the other end in the aligning direction.

4. The power control apparatus according to claim 2, wherein the plurality of projection portions are arranged to define a projections separation distance between adjacent two of the projection portions in the aligning direction, the projections separation distance being shorter than a distance between a first cooling surface and a second cooling surface of the mounting portion aligning in the orthogonal direction.

5. The power control apparatus according to claim 2, wherein a distance between two adjacent ones of the plurality of projection portions is shorter than both a span length of the projection portions in the one direction and a span length of the projection portions in the aligning direction.

6. The power control apparatus according to claim 1, wherein the electronic control circuit is further configured to perform:

notifying a vehicle of an abnormality based on information from the determining step.

* * * * *